United States Patent [19]

Schoofs et al.

[11] Patent Number: 4,994,955
[45] Date of Patent: Feb. 19, 1991

[54] HALF-BRIDGE DRIVER WHICH IS INSENSITIVE TO COMMON MODE CURRENTS

[75] Inventors: Franciscus A. C. M. Schoofs, Valkenswaard, Netherlands; Armin F. Wegener, Aachen, Fed. Rep. of Germany

[73] Assignee: North American Philips Corporation, New York, N.Y.

[21] Appl. No.: 459,095

[22] Filed: Dec. 29, 1989

[51] Int. Cl.[5] .......................................... H02M 7/521
[52] U.S. Cl. ....................................... 363/95; 363/17; 363/98; 363/132
[58] Field of Search ...................... 363/17, 24, 95, 98, 363/132, 134

[56] References Cited

U.S. PATENT DOCUMENTS 4,694,384 9/1987 Steigerwald et al. ................. 363/98
4,706,180 11/1987 Wills .................................... 363/132
4,864,479 9/1989 Steigerwald et al. ................. 363/17

OTHER PUBLICATIONS

D. F. Henderson: "An HVIC MOSFET/IGT Driver for Half-Bridge Topologies", HFPC, May 1988 Proceedings, pp. 237-245.
B. E. Taylor: "An Integrated High-Voltage Driver Simplifies Drive Circuits in Totem-Pole Inverters", PCI, Jun. 1988 Proceedings, pp. 166-170.

Primary Examiner—Robert Skudy
Assistant Examiner—Jeffrey Sterrett
Attorney, Agent, or Firm—Jack D. Slobod

[57] ABSTRACT

A half-bridge is made insensitive to transient induced common mode currents in a pair of control lines between a level shifter and a floating driver for a power transistor of the half-bridge by the provision in the receiver portion of the floating driver of a double differential amplifier responsive to the difference between the voltages developed across sense resistors in series with the control lines. The amplifier produces a pair of output voltages for selectively setting and resetting a flip-flop which controls the conductive state of the driven power transistor. The double differential amplifier has an inherent central dead zone, providing noise immunity, and optional clamp means to limit the extremes of the voltages developed across the sense resistors. The transmitter portion of the level shifter contains elements thermally and resistively matched to the receiver for determining the amplitudes of the transmitted control currents.

15 Claims, 2 Drawing Sheets

HALF-BRIDGE DRIVER WHICH IS INSENSITIVE TO COMMON MODE CURRENTS

BACKGROUND OF THE INVENTION

1. Field Of The Invention

The present invention relates to bridge-type circuits in which upper and lower power switch means selectively couple upper and lower rails of a D.C. supply to a load. In its particular aspects, the present invention relates to a driver for the power switch means which is insensitive to switching transients produced by the bridge.

2. Description Of The Prior Art

High voltage half-bridge circuits employing transistor switch means such as MOSFETs and IGTs find use in a variety of power applications including D.C. to A.C. inverters, motion control devices, switch mode power supplies and lighting ballasts. In such applications, the required D.C. supply can range up to 500 volts with the output of the half bridge capable of undergoing transitions between zero volts and the D.C. supply voltage at high slew rates. Monolithically integrated half-bridge driver circuits have recently become available as described, for example, in D.F. Henderson, "An HVIC MOSFET/IGT Driver For Half-bridge Topologies", HFPC, May 1988 Proceedings, pp. 237–245. The bridge driver described therein is of the dual channel type, comprising a high side channel including a high side driver, powered by a bootstrap supply voltage, for driving the upper or high side transistor of the half-bridge and a low or ground side channel including a low side driver for driving the low side or lower transistor thereof. The high side driver, and its bootstrap supply voltage, floats on the output of the half-bridge in order to properly drive the high side transistor. A level shifter is included in the high side channel for transmitting control signals over two lines from ground potential to a receiving portion of the high side driver. These control signals are typically in the form of a downwardly directed "ON" current pulse transmitted on one control line for selectively placing the high side transistor in a conductive state and a downwardly directed "OFF" current pulse transmitted on the other control line for selectively placing the high side transistor in a non-conductive state. The state of the high side transistor is controlled by an R/S flip-flop in the high side driver which is set by the "ON" pulse and reset by the "OFF" pulse.

Half-bridge drivers of the type described are prone to transient currents induced in the control lines due to high positive and negative slew rates (>10 kv/microsecond) at the output of the bridge which, when acting effectively across a parasitic capacitance of a few picofarads, can cause the parasitic capacitance to appear as a source of upwardly or downwardly directed transient currents in the control lines having amplitudes which may be greater than a few tens of milliamperes. Such transient currents tend to be induced simultaneously in both control lines in what we term a "common mode". Notwithstanding the simultaneity of the currents induced in the control lines, erroneous changes of state of the flip-flop can be caused with undesirable consequences ranging from erroneous output of the half-bridge to cross-conduction of current through simultaneously conducting high side and low side transistors. Furthermore, control may not be possible during the instants in which the transients are induced.

SUMMARY OF THE INVENTION

It is an object of the present invention to provide a floating driver for a power switch means of a half-bridge which is insensitive to common mode currents and noise in the control lines to the driver but is appropriately responsive to the "ON" and "OFF" control current pulses in the lines. It is a further object of the present invention to provide a transmitter portion of a level shifter which is thermally and resistively matched to the receiver portion of the floating driver. It is yet another object that the floating driver and the level shifter may be implemented in bipolar or MOS elements suitable for an integrated circuit realization.

Briefly, the aforementioned and other objects of the present invention are satisfied by configuring the floating driver as a differential means responsive the difference between the voltages developed across sense resistors by the currents in the control lines for controlling the ON/OFF state of the driven power switch means. This provides substantial operational immunity or insensitivity to unintended common mode transient currents in the control lines while providing substantial operational response to "ON" and "OFF" control current pulses transmitted therein, the latter not being in a common mode. The differential means includes a differential amplifier means having two outputs of opposite polarity providing "SET" and "RESET" inputs to a flip-flop whose logical state controls the conductive state of the driven power switch means.

A further feature of the invention is the incorporation of dead zone in the center of the operational input dynamic range of the differential receiver means to provide noise immunity. Yet another feature of the invention is the provision of matching means in the level shifter transmitter portion which adjusts the amplitudes of the "ON" and "OFF" control current pulses in relation to measures of the dead zone of the differential amplifier means and of the resistance of the sense resistors.

Other aspects of the invention depend on the choice of value for the sense resistors. If the sense resistors are chosen of relatively low ohmic value so that the voltages developed by the common mode currents across the sense resistors are well within the input dynamic range of the differential means, control is possible during the instants of the common mode currents, whether upwardly or downwardly directed. However, under such conditions, somewhat high power may be required in the transmitter portion, because the amplitudes of the "ON" and "OFF" control current pulses must be sufficiently large that the difference in the voltages across the sense resistors exceeds the dead zone of the differential amplifier means. If it is not necessary to permit control during the instants of the common mode currents, but merely to prevent erroneous response to the common mode currents, the sense resistors may be chosen at higher ohmic values, for reduced power requirements in the transmitter and/or for use with extremely high slew rates at the output of the half-bridge, but then clamp means are utilized to limit the voltages developed by the common mode currents across the sense resistors with respect to the bootstrap voltage supply base, for the purpose of protecting the differential means from excessive inputs.

The aforementioned half-bridge driver is implemented in either bipolar and MOS technology suitable for a high voltage integrated circuit and utilizes elements realizable in such technologies.

BRIEF DESCRIPTION OF THE DRAWINGS

Other objects, features and advantages of the present invention will become apparent upon perusal of the following detailed description of the preferred embodiments, in which.

DETAILED DESCRIPTION OF THE PREFERRED EMBODIMENTS

Figure 1:
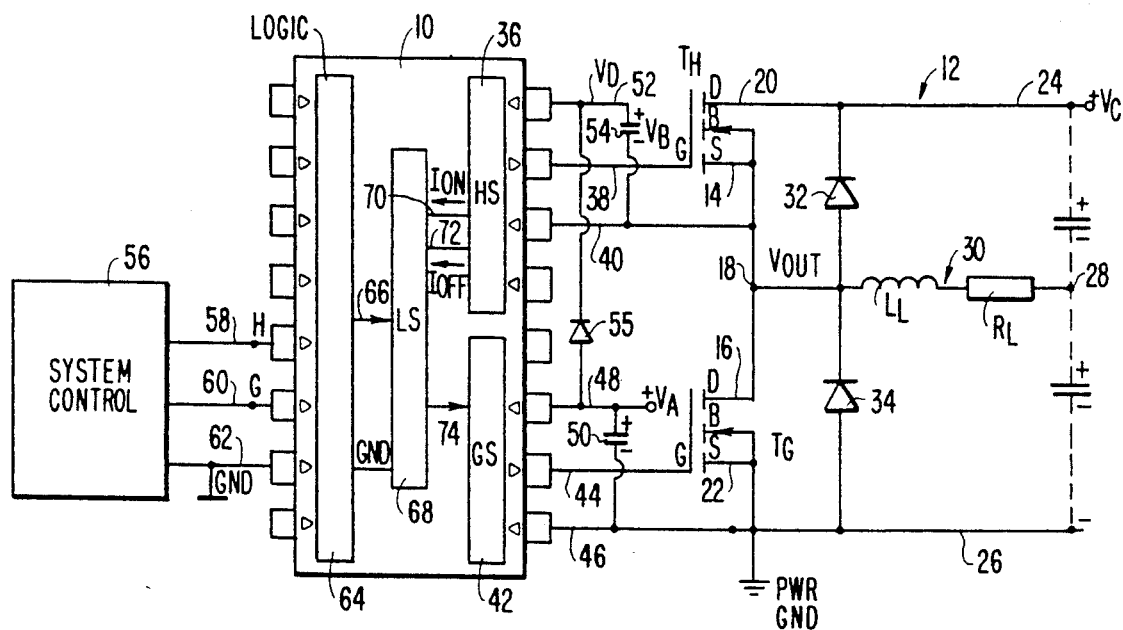
FIG. 1 a block diagram of the half-bridge driver of the present invention in conjunction with a schematic half-bridge circuit.

Referring first to FIG. 1 of the drawing, there is shown schematically the high voltage integrated circuit (HVIC) half-bridge driver 10 of the present invention in conjunction with a half-bridge 12 comprising high side MOSFET switch means $T_H$ and ground side MOSFET switch means $T_G$ connected in a totem-pole in which the source 14 of $T_H$ is connected to the drain 16 of $T_G$ at a node 18 forming output voltage $V_{out}$ of half-bridge 12. The drain 20 of $T_H$ and the source 22 of $T_G$ are respectively connected to the positive and negative rails, 24 and 26, of high voltage DC supply, $V_c$ which may have a voltage of up to about 500 volts. Negative rail 26 is connected to the power ground for half-bridge 12. Between half-bridge output node 18 and a center tap 28 of DC supply $V_c$ is connected a load 30 diagrammatically shown as the series combination of an inductance $L_L$ and resistance $R_L$. It should now be apparent that by placing only the high side power transistor $T_H$ in a conductive state the output voltage $V_{out}$ of half-bridge 12 can be brought to $+V_c$ while placing only the ground side power transistor $T_G$ in a conductive state brings the output voltage $V_{out}$ to power ground. Thus, for example, with a periodic pattern of alternation between conductive states of $T_H$ and $T_G$, an average voltage across the load of any selected amount ranging from $+V_c/2$ to $-V_c/2$ can be achieved depending upon the duty cycle of the conductive states. Because of the inductive nature of load 30, diodes 32 and 34 are provided respectively in parallel with Transistors $T_H$ and $T_G$ in a conventional manner to limit voltage transients at $V_{out}$ due to the switching of current through the inductive portion $L_L$ of load 30. Transistors $T_H$ and $T_G$ are illustratively enhancement type NMOS which are turned on by a positive gate to source voltage of a predetermined amount. Alternatively, IGT transistors may serve as suitable power switch means.

Half-bridge driver 10 comprises a high side driver 36 having an output voltage between lines 38 and 40 providing the gate to source voltage for the high side transistor $T_H$. Line 40 is connected to output mode 18 such that the output voltage between lines 30 and 40 floats on $V_{out}$. A ground side driver 42 is also provided in half-bridge driver 10 to provide the gate to source voltage for transistor $T_G$ between lines 44 and 46. Line 46 is connected to negative supply rail 26 such that the output voltage between lines 44 and 46 floats on power ground 26. Ground side driver 42 also receives an externally applied power source $+V_A$ applied between lines 48 and 46 and across capacitor 50. High side driver 36 receives an externally supplied bootstrap volta $V_B$ between lines 52 and 40 and across capacitor 54, which is developed from voltage $+V_A$ by the charging of capacitor 54 via a diode 55 connected between lines 48 and 52. Specifically, bootstrap voltage $V_B$ floats on output voltage $V_{out}$ and when transistor $T_H$ is off and transistor $T_G$ is on, such that $V_{out}$ is substantially coupled to power ground, capacitor 54 is charged via diode 52 to a voltage approaching $+V_A$.

Half-bridge driver 10 is controlled by an external system control 56 which provides to a logic interface portion 64 of half-bridge driver 10, a high side transistor control logic signal on line or channel 58 and a ground side transistor control logic signal on line or channel 60 which signals are referred to a common control or logic ground line 62. Logic ground 62 is not directly connected to power ground 26 in order to provide immunity to control 56 and logic interface 64 from power switching transients. Logic interface 64 provides control signals on lines 66 to level shifter 68 which performs a voltage translation of the control signals to the high side driver 36, which floats on $V_{out}$, and to the ground side driver 42, which floats on power ground. The translation in each case may take the same form involving a transmitter at the output of the level shifter and a receiver at the input of the applicable driver, 36 or 42. Specifically, with respect to the high side driver 36, control is obtained by transmitting a current pulse $I_{on}$ on line 70 for placing high side transistor $T_H$ in a conductive state and by transmitting a current pulse $I_{off}$ on line 72 for placing high side transistor $T_H$ in a non-conductive state. Similar control signals may be provided on lines 74 between level shifter 68 and ground side driver 42 for control of the conductive state of the ground side transistor $T_G$.

Figure 2:
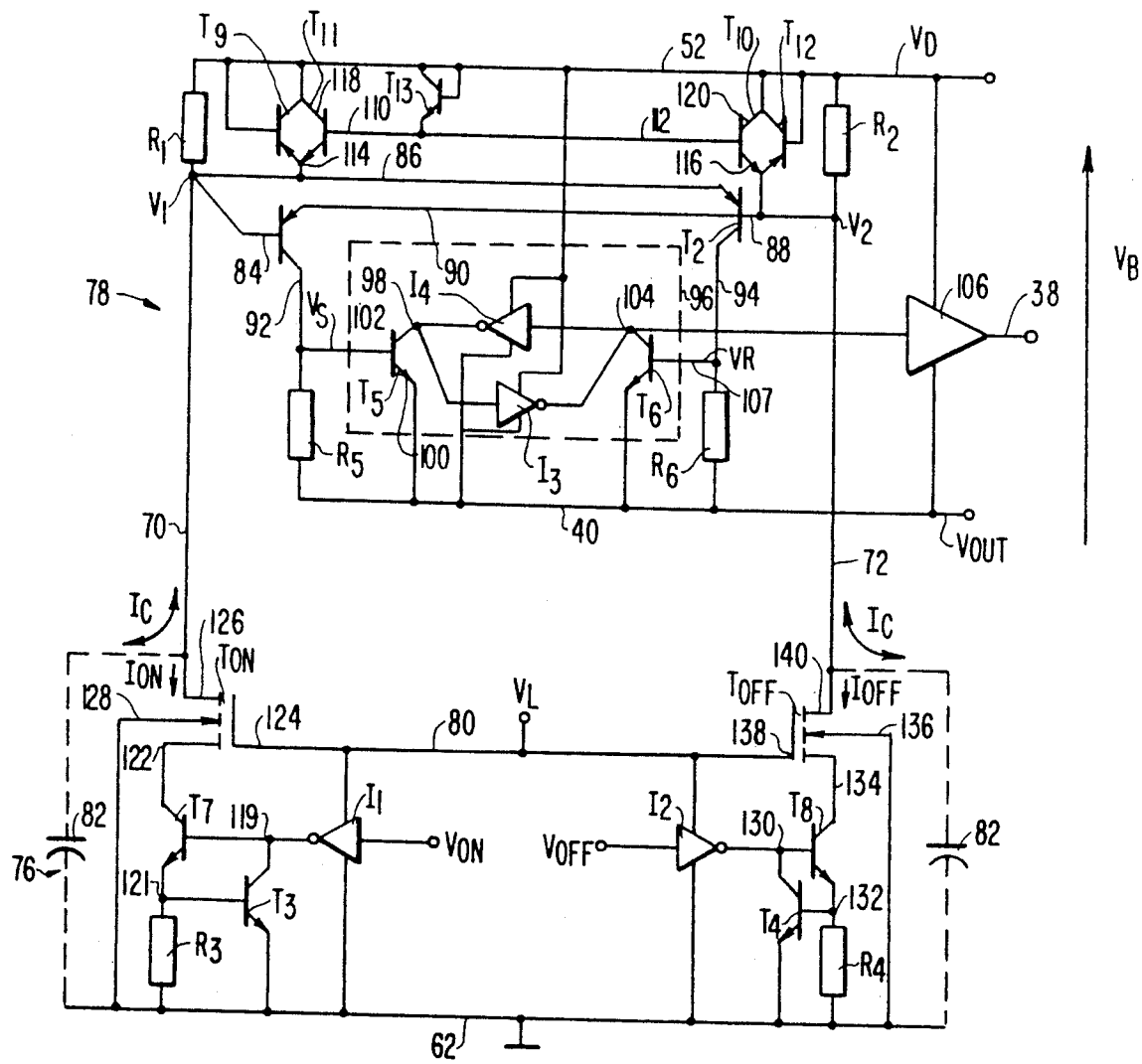
FIG. 2 is a schematic of transmitter and receiver portions of the half-bridge driver of FIG. 1, utilizing primarily bipolar technology.

FIG. 2 illustrates, in its lower part, the transmitter portion 76 of level shifter 68, and, in its upper part the receiver portion 78 of high side driver 36, which portions are connected by lines 70 and 72. Transmitter portion 76, which is powered by the logic power supply base $V_L$ between lines 48 and logic ground 62, receives pulsatile control input voltage $V_{on}$ and $V_{off}$ for respectively generating downwardly directed current pulses $I_{on}$ in line 70 and $I_{off}$ in line 72. It is intended that the current pulse $I_{on}$ will be transmitted alone to place the high side transistor $T_H$ in a conductive state and the current pulse $I_{off}$ will be applied alone to a place the high side transistor $T_H$ in a non-conductive state.

The receiver portion 78 is powered by the bootstrap voltage $V_B$, directed between lines 52 and 40, which floats on the output voltage $V_{out}$ of half-bridge 12. As a result, the upper line 52, has the volta $V_D$ which equals the sum of the instantaneous output voltage $V_{out}$ plus the boot strap voltage $V_B$. Equal sense resistors $R_1$ and $R_2$ are connected from line 52 respectively to control lines 70 and 72 in order to develop control voltages due to the control currents $I_{on}$ and $I_{off}$. For the purpose of analysis, it is most convenient to consider the voltages $V_1$ and $V_2$ respectively at the lower ends of the resistors $R_1$ and $R_2$. As should be apparent, a downwardly directed voltage pulse will be caused at $V_1$ due to a current pulse $I_{on}$ in line 70 while a negatively directed voltage pulse will caused at $V_2$ due to a current pulse $I_{off}$ in line 72.

Unfortunately, these intended voltage pulses are not the only signals present. Due to unwanted substantially equal parasitic capacitances 82, which effectively act between the control lines 70 and 72 and logic ground 62, substantially equal common mode currents $I_C$ flow simultaneously in control lines 70 and 72. These currents are due to the fact that the voltage $V_D$ has same high slew rates as present at $V_{out}$ which are effectively differentiated by the combinations of the sense resistors $R_1$ and $R_2$ and the parasitic capacitances 82. Effectively, the parasitic capacitances appear as current sources injecting common mode currents $I_C$ in control line 70 and 72. These common mode currents may flow in either direction.

The present invention, in order to provide insensitivity to voltages due to common mode currents $I_C$ incorporates a double differential amplifier means, comprising matched PNP transistors $T_1$ and $T_2$ and matched resistors $R_5$ and $R_6$, for responding to the difference between the voltages $V_1$ and $V_2$. In particular, the base emitter junctions of the transistors $T_1$ and $T_2$ are connected in opposite directions between $V_1$ and $V_2$. Thus, base 84 of transistor $T_1$ and emitter 86 of transistor $T_2$ are connected to $V_1$ while base 88 of transistor $T_2$ and emitter 90 of transistor $T_1$ are connected to $V_2$. The collectors 92 and 94 of transistors $T_1$ and $T_2$ are respectively connected to the upper ends of resistors $R_5$ and $R_6$ while the lower ends of these resistors are connected to line 40. As a result, an output "set" voltage $V_S$ is formed at the upper end of resistor $R_5$ while an output "reset" voltage $V_R$ is formed at the upper end of resistor $R_6$. It should now be apparent that when voltage $V_1$ falls below voltage $V_2$ while voltage $V_2$ remains above volta $V_{out}$, transistor $T_1$ is turned on producing a volta $V_S$ which approaches voltage $V_2$. Similarly, when voltage $V_2$ falls below voltage $V_1$, and voltage $V_1$ remains greater than $V_{out}$, transistor $T_2$ is turned on producing a voltage at $V_R$ which approaches $V_1$. Thus, common mode currents $I_C$ will produce substantially equal voltages $V_1$ and $V_2$ which will not turn on transistors $T_1$ or $T_2$ while the current pulse $I_{on}$ flowing only in line 70 will turn on at transistor $T_1$ and the current pulse $I_{off}$ flowing only in line 72 will turn on transistor $T_2$.

The "set" and "reset" outputs $V_S$ and $V_R$ of the aforementioned dual differential amplifier means are inputted to a R/S flipflop 96 which is comprised of a pair of inverters $I_3$ and $I_4$ each having its output forming the input of the other in a regenerative loop. NPN transistor $T_5$ has its collector at the junction 98 between the input to inverter $I_3$ and the output of inverter $I_4$, its emitter 100 connected to line 40 and its base 102 connected to $V_S$. With an inherent pull-up resistor (not shown) assumed at the input to inverter $I_3$, $V_S$ will turn on transistor $T_5$ in response to a current pulse $I_{on}$ which will pull junction 98 low and thereby setting the voltage at the junction 104 between the output of inverter $I_3$ and the input of inverter $I_4$ to a high condition. Junction 104 forms the output of flipflop 96 and is input to a buffer 106 having the output 38 for controlling the gate of the high side transistor $T_H$ of half-bridge 12. NPN transistor $T_6$ is similarly connected with its collector at junction 104, its base 107 connected to $V_R$ and its emitter 108 connected to line 40. Thus similarly, in response to a current pulse $I_{off}$ voltage $V_2$ will drop turning on transistor $T_2$ which then develops a volta $V_R$ to turn on transistor $T_6$ for resetting flipflop 96. Various embodiments of the invention are possible depending upon the choices of the values of the sense resistors $R_1$ and $R_2$. If these sense resistors are chosen of low ohmic value, it is possible to assure that $V_1$ and $V_2$ remain significantly above $V_{out}$ in response to downwardly directly common mode currents $I_C$ allowing dynamic range in the differential amplifier means to enable response to current pulses $I_{on}$ or $I_{off}$ occurring at the same time as these common mode currents. For example, if the parasitic capacitances 82 are less than 2 picofarads and the slew rates at $V_T$ are less than 10 kv-microsecond, common mode currents of less than 20 ma are produced. A value for $R_1 = R_2$ of 200 ohms would then produce voltages across sense resistors $R_1$ and $R_2$ of less than 4 volts due to common mode currents, while the bootstrap voltage $V_B$ can be on the order of 15 volts.

Dual amplifier means comprising transistors $T_1$ and $T_2$ also has an inherent central dead zone such that the difference between voltages $V_1$ and $V_2$ must exceed the $V_{be}$ of the transistors $T_1$ and $T_2$ in order to effect the desired turnon of the transistor $T_1$ or $T_2$. This dead zone is desirable for providing a measure of immunity to noise currents in lines 70 and 72 which develop voltages across the sense resistors $R_1$ and $R_2$. However, the current pulses $I_{on}$ or $I_{off}$ must be of sufficient amplitude for the voltages they develop cross resistors $R_1$ and $R_2$ to exceed $V_{be}$. For example, if $V_{be}$ is 0.7 volts, and it is therefore desired to generate a voltage of 1 volt across the sense resistors $R_1$ or $R_2$ in response to the current pulses $I_{on}$ or $I_{off}$, and the resistors are 200 ohms, then the amplitude of the current pulses must be at least 5 ma, which may require significant power to transmit.

In the event it is not necessary to transmit current pulses $I_{on}$ or $I_{off}$ during the instant of common mode transients $I_C$, then the resistors $R_1$ and $R_2$ may be chosen at higher ohmi values but than clamp means are advantageously utilized to limit the voltage developed across the sense resistors $R_1$, $R_2$. In FIG. 2, these clamp means comprise transistors $T_9$ through $T_{13}$.

NPN transistors $T_9$ and $T_{12}$ act as upwardly directed diodes across the sense resistors $R_1$ and $R_2$ respectively which prevent the voltages $V_1$ and $V_2$ from rising more than $V_{be}$ above voltage $V_D$. For preventing voltages $V_1$ and $V_2$ from falling below voltage $V_D$ by more than 2 $V_{be}$, there are provided the transistor $T_{13}$ which acts as a diode directed between line 52 and the bases 110 and 112 of NPN transistors $T_{11}$ and $T_{10}$ whose emitters 114, 116 are connected respectively to the voltages $V_1$ and $V_2$ and whose collectors 118, 120 are connected to line 52. These clamping means thereby establish a dynamic range for the voltages $V_1$ and $V_2$ within which the differential amplifier means may respond.

The transmitter portion 76 is preferably matched to the receiver portion 78 to compensate for temperature or manufacturing variations in the resistors $R_1$ and $R_2$ and the transistors $T_1$ and $T_2$. The transmitter portion 76 receives as inputs the voltages $V_{on}$ and $V_{off}$ developed by logic interface 64 which are input to inverters $I_1$ and $I_2$ respectively. The output of inverter $I_1$ is fed to the junction 119 of the base of NPN transistor $T_7$ and collector of NPN transistor $T_3$. The emitter of transistor $T_7$ and base of transistor $T_3$ are joined at 12 to the upper end of resistor $R_3$ while the lower end of resistor $R_3$ and the emitter of transistor $T_3$ are connected to logic ground 62. The collector of transistor $T_7$ is connected at 122 to the source of an enhancement type NMOS FET transistor $T_{on}$. By matching transistor $T_3$ to transistors $T_1$ and $T_2$ and by matching resistor $R_3$ to resistors $R_1$ and $R_2$, the appropriate current amplitude $I_{on}$ is generated in a response to a downwardly directed $V_{on}$ pulse. In particular, $T_3$ and $T_7$ interact to clamp the voltage across $R_3$ to $V_{be}$ and make the collector of transistor $T_7$ a source of current equal to $V_{be}/R_3$. By choosing $R_3$ smaller than $R_1$, the amplitude of the $I_{on}$ pulse produced will cause a voltage pulse across sense resistor $R_1$ sufficient for the different between $V_1$ and $V_2$ to exceed the dead zone of the dual differential amplifier means in the receiver 78. NMOS FET $T_{on}$ has its gate 124 connected to $V_L$ line 80, its drain 126 connected to control line 70 and its backgate 128 connected to logic ground 62. As a result, NMOS FET transistor $T_{on}$ acts as a well-defined barrier between the high slew rates present in the receiver 78 and the collector of transistor $T_7$ which sources $I_{on}$. In a similar fashion, the output of inverter $I_2$ is connected to the junction 130 of the base of NPN transistor $T_8$ and the collector of NPN transistor $T_4$, the emitter of transistor $T_8$ and the base of transistor $T_4$ are connected to the upper end of resistor $R_4$ at junction 132, and the lower end of resistor $R_4$ and the emitter of transistor $T_4$ are connected to logic ground 62. The collector of transistor $T_8$ is connected at 134 to the source of NMOS FET transistor $T_{off}$. Transistor $T_{off}$ further has its backgate 136 connected to logic ground 62, its gate 138 connected to $V_L$ line 80 and its drain 140 connected to control line 72 to form a barrier similarly to transistor $T_{on}$. Herein again, transistor $T_4$ is matched to transistors $T_1$ and $T_2$ and resistor $R_4$ is matched to resistors $R_1$ and $R_2$. Furthermore, $R_4$ may be chosen somewhat less than $R_3$ to produce a current amplitude $I_{off}$ greater than the current amplitude $I_{on}$ for enhancing the response to an off command.

The embodiment of FIG. 2 is amenable to an integrated circuit realization in which the various bipolar elements and resistors allow for matching the components in temperature characteristics and matching the resistors in resistance value.

Figure 3:
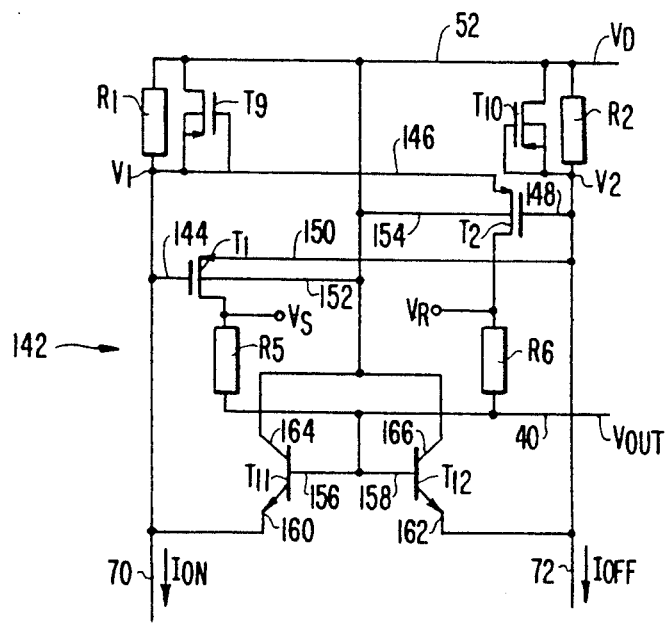
FIG. 3 is a schematic of the receiver portion of the half-bridge driver of FIG. 1, according to an alternate embodiment to that of FIG. 2, utilizing primarily MOS technology.

In FIG. 3, there is illustrated an alternate receiver portion 142 using primarily MOSFET technology, in which similar parts are similarly labeled to FIG. 2. Therein, the gate 144 of PMOS FET $T_1$ and the source 146 of PMOS FET $T_2$ are connected to $V_1$ while the gate 148 of $T_2$ and source 150 of $T_1$ are connected to $V_2$ in a manner analogous to FIG. 2 to produce the voltages $V_S$ and $V_R$ across resistors $R_5$ and $R_6$. The clamping means is somewhat different, however, from FIG. 2 utilizing MOSFET transistors $T_9$ and $T_{10}$ with their source, gate and backgate connected respectively to voltages $V_1$ and $V_2$ and their drains connected to voltages $V_D$. Transistors $T_9$ and $T_{10}$ are constructed in a known manner to have a parasitic diode junction directed from $V_1$ and $V_2$ respectively to $V_D$. As a consequence, these transistors prevent $V_1$ and $V_2$ from rising more than $V_{be}$ above $V_D$. Additionally, for forming parasitic diodes parallel to those formed by $T_9$ and $T_{10}$ to further prevent the voltages $V_1$ and $V_2$ from rising more than $V_{be}$ above $V_D$, the backgates 152 and 154 of transistors $T_1$ and $T_2$ are tied to $V_D$ to develop parasitic diodes in each transistor directed from source to backgate.

For limiting the lower extremes of $V_1$ and $V_2$ the NPN transistors $T_{11}$ and $T_{12}$ are provided with their bases 156, 158 connected to $V_{out}$, their emitters 160, 162 connected respectively to $V_1$ and $V_2$ and their collectors 164, 166 connected to $V_D$. These transistors $T_{11}$ and $T_{11}$ prevent $V_1$ and $V_2$ from falling more than $V_{be}$ below $V_{out}$. It should be equally understood, that if $R_1$ and $R_2$ are sufficiently low in ohmic value that the voltages $V_1$ and $V_2$ never fall close to $V_{out}$, the various clamping means may not be required.

The present invention has been described in specific detail, however, numerous modifications, omissions and additions are possible in those details within the intended spirited scope of the invention.

What is claimed is:

1. A device for controllably driving a half-bridge including a high side switch means and a low side switch means, said high side switch means coupled to an output of the half-bridge and having a drive input, said device including a high side driver comprising:

a high side drive output for coupling to the drive input of said high side switch means for selectively placing said high side switch means in an ON state or an OFF state; means for receiving high side control currents in two lines, each line having its own sense resistors in series with said each line; and differential means coupled between said sense resistors and said high side drive output for controlling the state of the high side switch means in response to the difference between the voltages at said sense resistors within an operational dynamic range;

whereby substantial operational immunity is provided to common mode currents injected in said lines by parasitic capacitance.

2. The device as claimed in claim 1, wherein said differential means comprises a differential amplifier means having two inputs respectively coupled to the sense resistors of said two lines and having two amplifier outputs of opposite polarity; a state device having a SET input coupled to one of said amplifier outputs, a RESET input coupled to the other of said amplifier outputs, and an output coupled to said high side drive output.

3. The device as claimed in claim 1, wherein said differential means has a dead zone at the center of its operational dynamic range, the ohmic values of said sense resistors and the width of said dead zone being chosen to provide said differential means with substantial operational immunity to noise currents in said lines, while having substantial operational response to said control currents.

4. The device as claimed in claim 1, wherein said high side driver further comprises means for receiving a bootstrap voltage supply base floating on the output of the half-bridge, and clamping means for limiting the voltages on the lines with respect to the bootstrap voltage supply base.

5. The device as claimed in claim 4, wherein said clamping means comprises at least two parasitic PN junctions.

6. The device as claimed in claim 1 wherein the sense resistors are chosen of sufficiently low ohmic values that voltages at said sense resistors due to said common mode currents and said control currents, when existing contemporaneously, substantially do not fall outside of the operational dynamic range of said differential amplifier means.

7. The device as claimed in claim 3 further comprising means for transmitting said control currents in said lines including means for adjusting the amplitudes of said control currents based on elements in said transmitting means matched to elements in said high side driver providing a measure of the ohmic values of said sense resistors and the width of said dead zone.

8. The device as claimed in claim 3, wherein said high side driver further comprises means for receiving a bootstrap voltage supply base floating on the output of the half-bridge, and clamping means for limiting the voltages on the lines with respect to the bootstrap voltage supply base.

9. The device as claimed in claim 8, wherein said clamping means comprises at least two parasitic PN junctions.

10. The device as claimed in claim 7, wherein said high side driver further comprises means for receiving a bootstrap voltage supply base floating on the output of the half-bridge, and clamping means for limiting the voltages on the lines with respect to the bootstrap voltage supply base.

11. The device as claimed in claim 10, wherein said clamping means comprises at least two parasitic PN junctions.

12. The device as claimed in claim 10, wherein said differential means comprises a differential amplifier means having two inputs respectively coupled to the sense resistors of said two lines and having two amplifier outputs of opposite polarity; a state device having a SET input coupled to one of said amplifier outputs, a RESET input coupled to the other of said amplifier outputs, and an output coupled to said high side drive output.

13. The device as claimed in claim 6, wherein said high side driver further comprises means for receiving a bootstrap voltage supply base floating on the output of the half-bridge, and clamping means for limiting the voltages on the lines with respect to the bootstrap voltage supply base.

14. The device as claimed in claim 13, wherein said clamping means comprises at least two parasitic PN junctions.

15. The device as claimed in claim 13, wherein said differential means comprises a differential amplifier means having two inputs respectively coupled to the sense resistors of said two lines and having two amplifier outputs of opposite polarity; a state device having a SET input coupled to one of said amplifier outputs, a RESET input coupled to the other of said amplifier outputs, and an output coupled to said high side drive output.

* * * * *